(12) United States Patent
Chang et al.

(10) Patent No.: US 7,319,625 B2
(45) Date of Patent: Jan. 15, 2008

(54) BUILT-IN MEMORY CURRENT TEST CIRCUIT

(75) Inventors: Yeong-Jar Chang, Taichung County (TW); Kun-Lun Luo, Hsinchu (TW); Jung-Chi Ho, Taipei County (TW); Cheng-Wen Wu, Hsinchu (TW); Chin-Jung Su, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/481,966

(22) Filed: Jul. 7, 2006

(65) Prior Publication Data
US 2007/0153597 A1 Jul. 5, 2007

(30) Foreign Application Priority Data
Dec. 30, 2005 (TW) .............................. 94147866 A

(51) Int. Cl.
*G11C 7/00* (2006.01)
(52) U.S. Cl. ...................................... 365/201; 365/242
(58) Field of Classification Search ................ 365/201, 365/242
See application file for complete search history.

(56) References Cited

U.S. PATENT DOCUMENTS

| | | | | |
|---|---|---|---|---|
| 5,459,737 A | * | 10/1995 | Andrews | 714/733 |
| 6,668,348 B1 | * | 12/2003 | Nakamura | 714/733 |
| 6,934,205 B1 | * | 8/2005 | Pandey et al. | 365/201 |
| 2001/0009523 A1 | * | 7/2001 | Maeno | 365/201 |
| 2003/0002365 A1 | * | 1/2003 | Sato et al. | 365/201 |
| 2007/0047347 A1 | * | 3/2007 | Byun et al. | 365/201 |
| 2007/0064510 A1 | * | 3/2007 | Zerbe et al. | 365/201 |

* cited by examiner

*Primary Examiner*—Michael T Tran
(74) *Attorney, Agent, or Firm*—Birch, Stewart, Kolasch & Birch, LLP

(57) ABSTRACT

A built-in memory current test circuit to test a memory on a chip is disclosed, comprising a built-in self-test circuit and a dynamic current generation module. The built-in self-test circuit is disposed on the chip to receive and process a test signal and generate a control signal to control operation of the memory and a current control code. The dynamic current generation module, also disposed on the chip, produces a test current into the memory based on the current control code. The current switch time is reduced in the built-in memory current test circuit, and an integrated test combining functional and stress tests can thus be performed.

18 Claims, 6 Drawing Sheets

| Operation | Element Code (E.C) | Current Control Code (C.C) | High Level Code (H.L.C) |
|---|---|---|---|
| r | 0000 | 00 | 00 |
| $rw_1$ | 0001 | 00 | 01 |
| $rw_2$ | 0101 | 01 | 01 |
| $rw_3$ | 1001 | 10 | 01 |
| $rw_4$ | 1101 | 11 | 01 |
| $w_1r$ | 0010 | 00 | 10 |
| $w_2r$ | 0110 | 01 | 10 |
| $w_3r$ | 1010 | 10 | 10 |
| $w_4r$ | 1110 | 11 | 10 |
| $rw_1r$ | 0011 | 00 | 11 |
| $rw_2r$ | 0111 | 01 | 11 |
| $rw_3r$ | 1011 | 10 | 11 |
| $rw_4r$ | 1111 | 11 | 11 |

FIG. 4

BUILT-IN MEMORY CURRENT TEST CIRCUIT

BACKGROUND OF THE INVENTION

1. Field of the Invention

The invention relates to memory testing and more particularly to a built-in memory test circuit having a dynamic current source.

2. Description of the Related Art

Conventional memory testing checks only if any errors have occurred in basic memory operations, referred to as a functional test. In a functional test, normal operating voltage or current is applied respectively to voltage-based memories such as SRAM, DRAM and FLASH and current-based memories such as magneto-resistive random access memories (MRAM). Stress testing, however, is performed under abnormal conditions such as abnormal temperature or abnormal operating voltage and current respectively for voltage and current-based memories. Memory reliability can thus be further improved. Although stress test costs extra testing time, it is indispensable.

FIG. 1 is a block diagram of a conventional memory current test circuit, illustrating how stress test is performed on a current-based memory. As shown, a memory current test circuit 10 comprises a chip 100 on which are disposed a memory 102 to be tested, a built-in self-test (BIST) circuit 104, and a current mirror 106. The chip 100 is connected externally to automatic test equipment (ATE) 108 having a reference current source 110.

The BIST 104 receives a test signal $S_{TEST}$ representing a test algorithm such as March C-test algorithm from the ATE 108. The test algorithm is a sequence consisting of at least one test element, each representing at least one successive memory operation. After receiving the test signal $S_{TEST}$, the BIST 104 generates an operating signal $S_{op}$, directing the memory 102 to perform a series of test operations represented by the test algorithm. During a memory test, the BIST 104 further receives a data signal $S_Q$, checking for errors in the data signal $S_Q$, and returning an error output signal $S_{ERRO}$ to the ATE 108 if any are detected.

The current mirror 106 is connected to the reference current source 110 within the ATE 108 to receive a reference current $I_{REF}$ provided by the reference current source 110, generating a test current $I_{TEST}$ required in the memory testing according to the reference current $I_{REF}$, and then providing the test current $I_{TEST}$ to the memory 102.

To perform a stress test on the memory 102, it is required to provide the memory 102 with a different test current $I_{TEST}$. The reference current source 110 of the ATE 108 thus must be able to provide a different reference current $I_{REF}$. For this reason, the reference current source 110 is designed to be switched via a control of ATE 108 to provide the different reference current $I_{REF}$. Alternatively, the current mirror 106 must be able to receive required amount of the reference current $I_{REF}$. However, extra pins are required in the reference current source 110 or the current mirror 106 to select an appropriate reference current $I_{REF}$ such that the required $I_{TEST}$ is generated.

Further, ATE 108 is required to reset $I_{TEST}$ to different values in a stress testing. Much time is thus wasted. To conserve test time, all writing operations are generally performed with the same test current $I_{TEST}$ in a March C- test algorithm. More specifically, writing operations performed with different test currents are included in neither the same test element nor the different test elements in a March C- test algorithm. For the same reason, functional testing and stress testing are performed with a different test current $I_{TEST}$ but the same test algorithm.

For example, a Mach C- test algorithm for a functional testing is:

$$\{\mathfrak{d}(w_10);\Uparrow(r0, w_11);\Uparrow(r1, w_10);\Downarrow(r0, w_11);\Downarrow(r1, w_10);\mathfrak{d}(r0)\} \quad (1),$$

which comprises six test elements, where w and r in any test element respectively represent writing and reading operations; 0 and 1 behind w or r respectively represent bit to be read or written; ⇑, ⇓ and ⇕ represent the operating direction of memory address, respectively denoting upwards, downwards, arbitrarily selected from upwards and downwards; suffix "1" behind each of the writing operations within { } represent that all the writing operations are performed with a first test current. The Mach C- test algorithm includes a total of ten operations performed with the same test current. This March C- test algorithm is often called a 10N test algorithm where N denotes the capacity of the memory. Also, 10N is representative of the test time.

Stress test, however, is generally performed by repeating the same test algorithm with different test currents. More specifically, the test algorithm in a stress test is, the test algorithm (1) followed by another test algorithm:

$$\{\mathfrak{d}(w_20);\Uparrow(r0, w_21);\Uparrow(r1, w_20);\Downarrow(r0, w_21);\Downarrow(r1, w_20);\mathfrak{d}(r0)\} \quad (2)$$

where suffix "2" behind each of the writing operations within { } represent that all the writing operations are performed with a second test current. The test algorithm (2) costs 10N of test time. Before a test represented by the test algorithm (2) is performed, the ATE 108 must reset the test current $I_{TEST}$. Resultantly, the total test time is $20N+T_{ATE}$, where $T_{ATE}$ is setting time of the test current $I_{TEST}$ consumed by the ATE 108. Similarly, when the test current $I_{TEST}$ is to be changed subsequently to perform further another similar test, the total test time is increased by $(10N+T_{ATE})$, and so forth. Consequently, the total test time in a stress test is very long.

In respect to other prior technologies, Jian Liu et al propose a built-in current sensor to control operating current in memories to enhance efficiency of memory testing (referred to "SRAM test using on-chip dynamic power supply current sensor" in Proc. IEEE Int. Workshop on Memory Technology, Designing and Testing (MTDT), Aug. 1998, pp. 57-63.). Hong-Sik Km et al. in Korea also disclose a paper on memory testing using two reference currents by comparing the operating current of the memory and the two reference currents to detect errors in the memory (referred to ("DPSC SRAM transparent test algorithm", in Asian Test Symposium (ATS), Nov. 2002 Page(s):145-150)). However, extra pins are needed to select an appropriate test current. Both of the two conventional technologies focus merely on partial test components or test current in a normal test, not with a complete environment.

In the conventional technology, when a test is to be performed on different memories on a system on a chip (SOC), ATE is required to reset the test current for the memories individually since different memories require different test currents. This means that different memories can only be tested by turn and not in parallel at the same time. Consequently, if N memories are to be tested, the total test time is:

$$\sum_{2}^{N} T_{ATE}(n) + \sum_{1}^{N} T_M(n), \quad (3)$$

where $T_{ATE}(n)$ denotes the setting time of the test current for the nth memory consumed by the ATE, and $T_{ATE}(n)$ denotes the test time of the nth memory. The total test is very long.

BRIEF SUMMARY OF THE INVENTION

The invention discloses a built-in self-test circuit having a dynamic source and further provides a new test element to be applied in the stress testing for current-based memories such as MRAMs to reduce test time and hence test cost.

The invention provides a built-in memory current test circuit to perform a test on a memory on a chip, comprising a built-in self-test circuit disposed on the chip, receiving a test signal corresponding to a test algorithm, producing a control signal to control operations of the memory and a current control code, wherein the test algorithm is a sequence consisting of at least one test element each representing at least one successive memory operation, and a dynamic current generation module 206 disposed on the chip, receiving the current control code and generating a test current to the memory according to the current control code.

One aspect of the invention is the dynamic current source for the built-in memory current test circuit. Accordingly, there is no need to dispose extra pins in the reference current or the current mirror to control the test current by ATE as in the conventional technology. In the invention, the test current can be controlled via the dynamic current source by the BIST.

Another aspect of the invention is the built-in memory current test circuit having the ability to execute a test algorithm consisting of new test elements, thereby realizing an integrated test combining functional test with stress test, further reducing test time.

Another aspect of the invention is that, since the dynamic current source can be designed according to memories, the built-in memory current test circuit is able to perform a parallel test on a plurality of memories in a SOC system, thereby reducing test time.

BRIEF DESCRIPTION OF THE DRAWINGS

The invention can be more fully understood by reading the subsequent detailed description and examples with references made to the accompanying drawings, wherein:

FIG. 4 is a truth table in accordance with an embodiment of the invention, listing element codes, current control code and high level operation corresponding to different memory operations when the built-in memory current control circuit of FIG. 3 executes inventive March C- test elements;

DETAILED DESCRIPTION OF THE INVENTION

Figure 2:
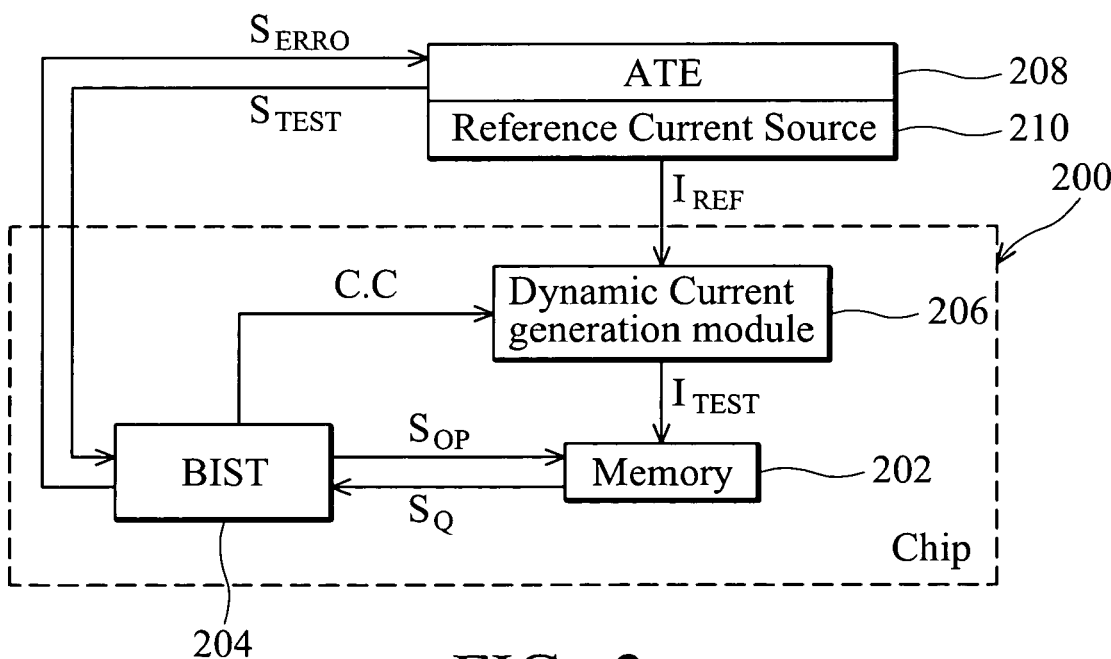
FIG. 2 is a block diagram of a built-in memory current test circuit in accordance with an embodiment of the invention.

FIG. 2 is a block diagram of a built-in memory current test circuit in accordance with an embodiment of the invention. As shown, a built-in memory current test circuit 20 comprises a chip 200, on which are disposed a current-based memory 202 such as a MRAM, a built-in self-test circuit (hereafter abbreviated as BIST) 204, and a dynamic current generation module 206. Both the BIST 204 and the dynamic current generation module 206 are connected externally to automatic test equipment (hereafter abbreviated as ATE) 208 comprising a reference current source 210.

The BIST 204 receives a test signal $S_{TEST}$ from ATE 208 corresponding to a test algorithm such as March C- test algorithm. The test algorithm is a sequence consisting of at least one test element each representing at least one successive memory operation. After receiving and processing the test signal $S_{TEST}$, the BIST 204 generates an operating signal $S_{OP}$ to the memory 202, to control reading/writing operations of the memory 202, memory address where the writing/reading operations are to be performed and data to be written into the memory 202, and also generates a current control code C.C to the dynamic current generation module 206 to control a test current $I_{TEST}$ producing by the dynamic current generation module 206. During a memory test process, the BIST 204 further receives a data signal $S_Q$, checking for errors in the data signal $S_Q$ has any error, and returns an error output signal $S_{ERRO}$ to ATE 208 if any are detected.

The dynamic current generation module 206 is connected externally to the reference current source 210 within the ATE 208. The dynamic current generation module 206 generates the test current $I_{TEST}$ to the memory 202 by referring to the reference current $I_{REF}$. The flow of the test current $I_{TEST}$ is controlled by the current control code C.C from the BIST 204. Since the reading/writing operations, the reading/wring address, and the data to be written are all controlled by the operating signal $S_{OP}$, and the test current $I_{TEST}$ is controlled by the current control code C.C, the memory 202 is able to perform successive testing operations represented by the test algorithm.

Figure 1:
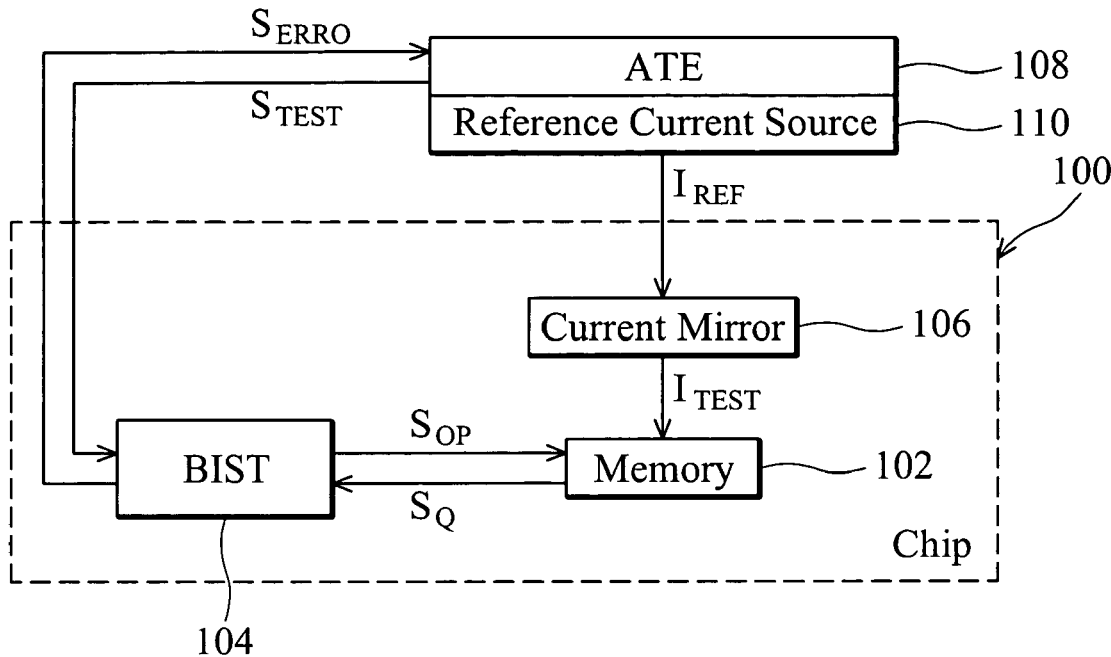
FIG. 1 is a block diagram of a conventional memory current test circuit.

Since the built-in memory current test circuit 20 of FIG. 2 comprises a built-in dynamic current generation module 206 on the chip 200, the test current $I_{TEST}$ is able to be changed more rapidly than in the conventional memory current test circuit 10 of FIG. 1. Accordingly, writing operations performed with different test currents can be included not only in different test element but also in the same test element of the same test algorithm, unlike the conventional technology.

The invention further provides a new memory test element. To maintain representation of memory test element, the new memory test element differs a conventional test element only in writing operations—w (writing) is changed to $w_i$ (writing with the i th current). For example, the new memory test element can be ⇓($w_1$0) (writing downwards with the first current), ⇑($r1w_2$0)(upwards, reading 1 first, then writing 0 with the second current), or ⇑(w,1r1$w_2$0r0)(upwards, writing 1 first, then reading 1, then writing 0 with the second current, and then reading 0) and etc. It is noted that the built-in memory current test circuit can be designed to support not only the new memory test elements but also conventional test elements.

Memory test algorithms in accordance with two exemplary embodiments of the invention show advantages of the invention beyond the conventional technologies in the following.

In one exemplary embodiment, a memory test algorithm is $$⇑(w_1 0), ⇑(w_2 0, r0), ⇑(w_1 1, r1) \qquad (4),$$

wherein $w_1$ and $w_2$ respectively represent writing operations with first and second currents; r represents reading operation; 0 and 1 respectively represent bit to be read or written; ⇑, ⇓, and ⇕ represent operating directions of memory address, respectively denoting upwards, downwards, arbitrarily selected from upwards and downwards. The test algorithm (4) includes a total of 5 operations and is thus often called a 5N test algorithm. The test time is often represented by 5N.

However, when utilizing the conventional memory current test current 10 to realize the same testing procedure, the ATE 108 is required to reset the test current when the test current is to be changed. Specifically, the test algorithm can be written as three algorithms: $\{⇑(w_1 0)\}$, $\{⇑(w_2 0, r0)\}$, and $\{⇑(w_1 1, r1)\}$. The ATE 108 must reset the test current between any two algorithms. Resultingly, the total test time is $(1N+2N+2N+2T_{ATE})=5N+2T_{ATE}$, where $T_{ATE}$ is the setting time of test current consumed by the ATE 108. Compared to the test time 5N of the invention, the conventional technology takes $2T_{ATE}$ more.

In another exemplary embodiment, an enhanced March C- test algorithm is:

$$\{⇕(w_1 0); ⇑(r0, w_1 1); ⇑(r1, w_1 0); ⇓(r0, w_2 1, r1); ⇓(r1, w_2 0, r0); ⇕(r0)\} \qquad (5),$$

a combination of algorithms (1) and (2) in the conventional technology. In the test algorithm (5), a reading operation is introduced in the fourth and fifth test elements in order to detect effects induced by a different writing current. As such, the test operation is an integrated testing combining functional test and stress test and thus has less complexity.

The test algorithm (5) includes 12 operations and is thus referred to as a 12N test algorithm. The test time is also 12N. Compared to the test time $20N + T_{ATE}$ in the conventional technology, the test time is $8N+T_{ATE}$ less in the embodiment. Ignoring $T_{ATE}$ to simply estimate the percentage difference, the test time in the invention is 40% less than the conventional technology.

Figure 3:
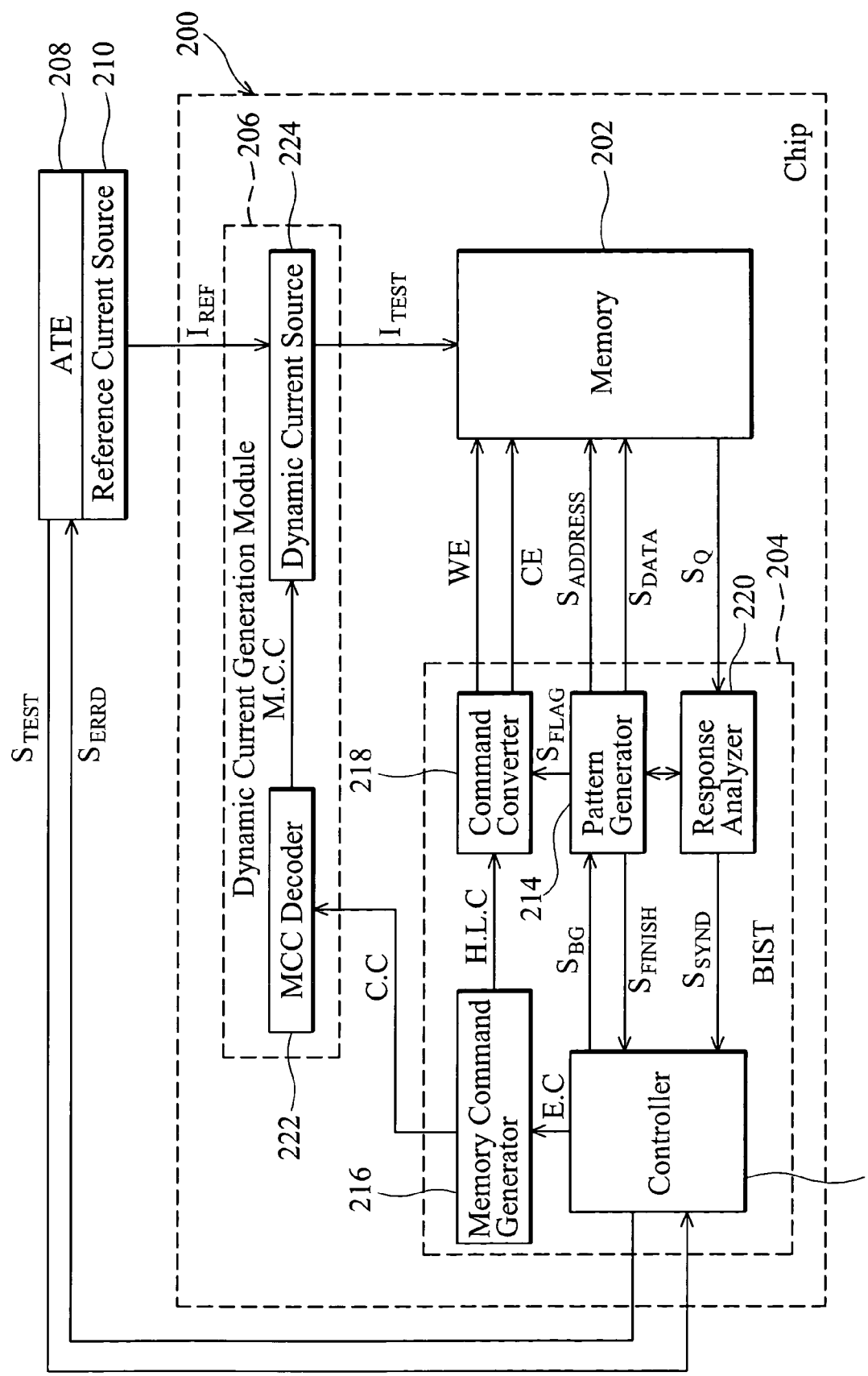
FIG. 3 is a more detailed block diagram of the built-in memory current test circuit of FIG. 2 in accordance with an embodiment of the invention.

FIG. 3 is a more detailed block diagram of the built-in memory current test circuit 20 of FIG. 2 in accordance with an embodiment of the invention, illustrating the BIST 204 and the dynamic current generation module 206 more specifically. As shown, the BIST 204 comprises a controller 212, a pattern generator 214, a memory command generator 216, a command converter 218, and a response analyzer 220. The dynamic current generation module 206 comprises a memory control current decoder (hereafter abbreviated as MCC decoder) 222 and a dynamic current source 224.

The controller 212 communicates with the ATE 208 and receives a test signal $S_{TEST}$ corresponding to a test algorithm, processing the test signal $S_{TEST}$ and generates an element code E.C and a background signal $S_{BG}$ accordingly. The element code E.C corresponds to successive reading/writing operations represented by each of the test elements in the test algorithm, concerned with neither operating direction nor data to be written/read. As described, the test elements can be conventional test elements, which means that the elements code E.C corresponds to successive reading/writing operations such as w(writing), rw(reading first and then writing), or can be new memory test element, which means that the element code E.C corresponds to successive memory operations such as $w_1$ (writing with the first current) or $rw_2$ (reading first, and writing with the second current). The background signal $S_{BG}$ corresponds to operation direction (downwards, upwards, or arbitrarily selected from downwards and upwards) and bit to be written/read represented by the tests elements in the test algorithm, not concerned with the successive reading/writing operations. The controller 212 sequentially transmits the background signal $S_{BG}$ and the element code E.C respectively to the pattern generator 214 and the memory command generator 216.

After the pattern generator 214 receives the background signal $S_{BG}$, it converts the background signal $S_{BG}$ to a writing data signal $S_{DATA}$ and an address signal $S_{ADDRESS}$ respectively corresponding to data to be written to the memory in a writing operation and memory address at which the writing or reading operation to be performed. The pattern generator 214 then passes the writing data signal $S_{DATA}$ and the address signal $S_{ADDRESS}$ to the memory 202. Additionally, after the testing is finished, the pattern generator generates a finish signal $S_{FINISH}$ to the controller 212 to complete the whole testing process.

After the memory command generator 216 receives the element code E.C, it generates a high level code H.L.C and a current control code C.C. The high level code H.L.C corresponds to the memory operations represented by the element code E.C such as reading, reading first and then writing and is not concerned with the test current. The current control code C.C, on the contrary, corresponds to the test current $I_{TEST}$ used in the operation represented by the element code E.C and is not concerned with the memory operations. The memory command generator 216 then passes H.L.C and C.C respectively to the command converter 218 and the MCC decoder 222.

After the command converter 218 receives the high level code H.L.C, it converts it to a write/read enable signal WE and a chip enable signal CE, and then transmits WE and CE both to the memory 202 such that the memory 202 performs a reading or writing operation as required. Concurrently, the command converter 218 receives a flag signal $S_{FLAG}$ from the pattern generator 214 to coordinate signal timings between each other (the writing data signal $S_{DATA}$ and the address signal $S_{ADDRESS}$ provided by the pattern generator 214 and the read/write enable signal WE and the chip enable signal CE provided by the command converter 218) and also produces a command to instruct the pattern generator 214 to switch to the next memory address.

After the MCC decoder 222 receives the current control code C.C from the memory command generator 216, it coverts the current control code C.C to a memory current control signal M.C.C and provides M.C.C to the dynamic current source 224.

The dynamic current source 224 are connected externally to the reference current source 212 within the ATE 210, receiving the reference current $I_{REF}$, and generating the test current $I_{TEST}$ required to drive the memory 202 in a testing according to the reference current $I_{REF}$ and the memory current control signal M.C.C received from the MCC decoder 222. The memory 202, driven by the test current $I_{TEST}$ controlled by M.C.C, is thus able to perform a series of test operations represented by the test algorithm according to writing data signal $S_{DATA}$, address signal $S_{ADDRESS}$, read/write enable signal WE and chip enable signal CE.

When the memory 202 performs testing operations, the response analyzer 220 receives a data signal $S_Q$, analyzing and checking if data $S_Q$ has errors. If an error in $S_Q$ is detected, the response analyzer 220 then feedbacks a syndrome signal $S_{SYND}$ to the controller 212. The controller 212 then feedbacks an error output signal $S_{ERRO}$ to ATE 208.

Relations between successive memory operations, the element code E.C, the background data $S_{BG}$, the high level code H.L.C, and the current control code C.C when a test algorithm executed by the built-in memory current test circuit 20 consists of new memory test elements is described in detail by an example. For example, when the new memory test element is ⇑(r0, w₁1,r1, w₂ 0)(upwards, first read 0, then write 1 with a first current, then read 1, then write 0 with a second current), the element code E.C corresponds to rw₁rw₂ (read first, then write with a first current, then read, and then write with a second current), the high level code H.L.C corresponds to rwrw(read first, then write, then read, and then write), and the current control code C.C corresponds to the first current first and then the second current.

It is noted that not only can the built-in memory current test circuit execute the new March test algorithm but also the controller 212 and the control command converter 218 can be designed to support conventional algorithms and reset the test current $I_{TEST}$ of the dynamic current generation module 206 only before a different test algorithm is executed.

FIG. 4 is a truth table in accordance with an embodiment of the invention listing element codes E.C, current control code C.C and high level code H.L.C corresponding to different memory operations when the built-in memory current control circuit of FIG. 3 executes new March test elements. Four different writing currents are taken as an example in the embodiment and accordingly writing operations with the four different writing currents are represented as $w_1 \sim w_4$. As shown in FIG. 4, in the element code E.C generated by the encoded test signal $S_{TEST}$, the former and latter two bits are respectively the current control code C.C and the high level code H.L.C. As such, the memory command generator 216 requires no complicated decoders and encoders to respectively decode the element code E.C after receiving the element code E.C when generating the high level code H.L.C and the current control code C.C. The decoding and encoding process will become more complicated with the increase of number of the test currents. Nevertheless, it is relatively simple.

Figure 5:
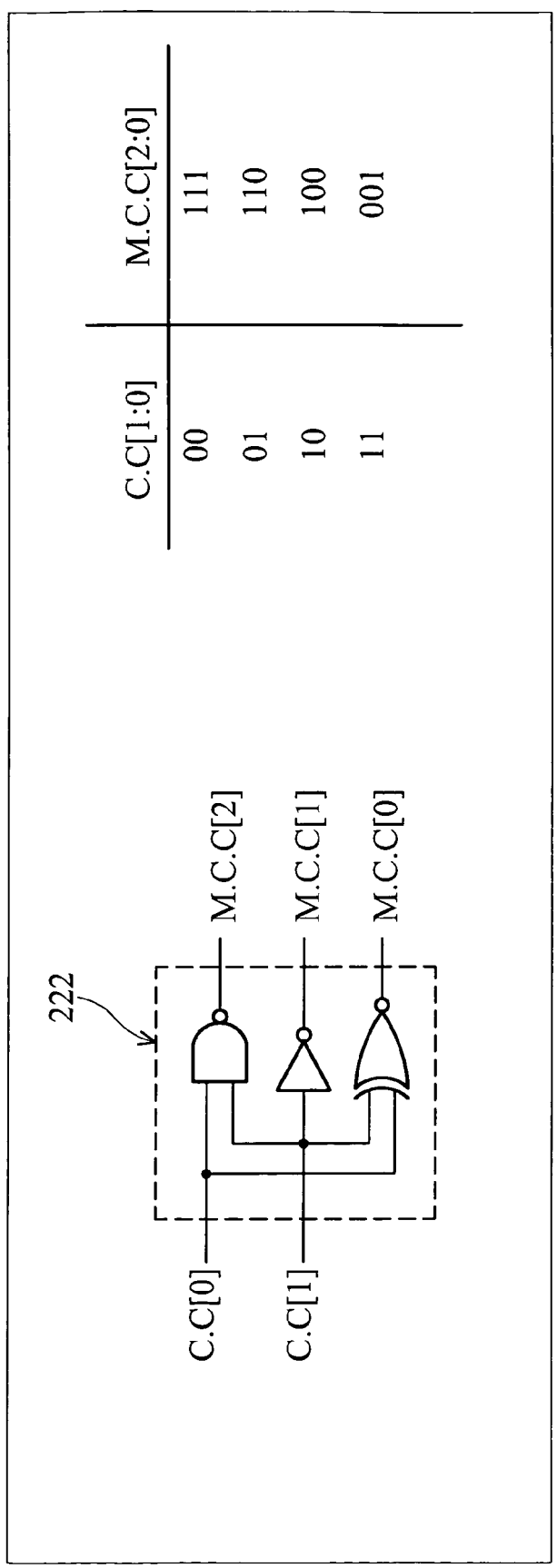
FIG. 5 is a schematic diagram of the MCC decoder of FIG. 3 in accordance with an embodiment of the invention and a truth table of the current control code corresponding to memory current control signal.

FIG. 5 is a schematic diagram of the MCC decoder 222 of FIG. 3 in accordance with an embodiment of the invention and a truth table of the current control code C.C corresponding to memory current control signal M.C.C, wherein the current control code C.C has been referred to in the truth table of FIG. 4 (both have four writing currents) to simplify the explanation. As shown, when the current control code C.C is 00, the memory current control signal M.C.C is 111, controlling the dynamic current source 224 to output a maximum current; when the current control code C.C is 01, the memory current control signal M.C.C is 110, controlling the dynamic current source 224 to output less current. Since the MCC decoder 222 is constructed with simple logic gates, circuit area is saved and signal delay is low.

Figure 6:
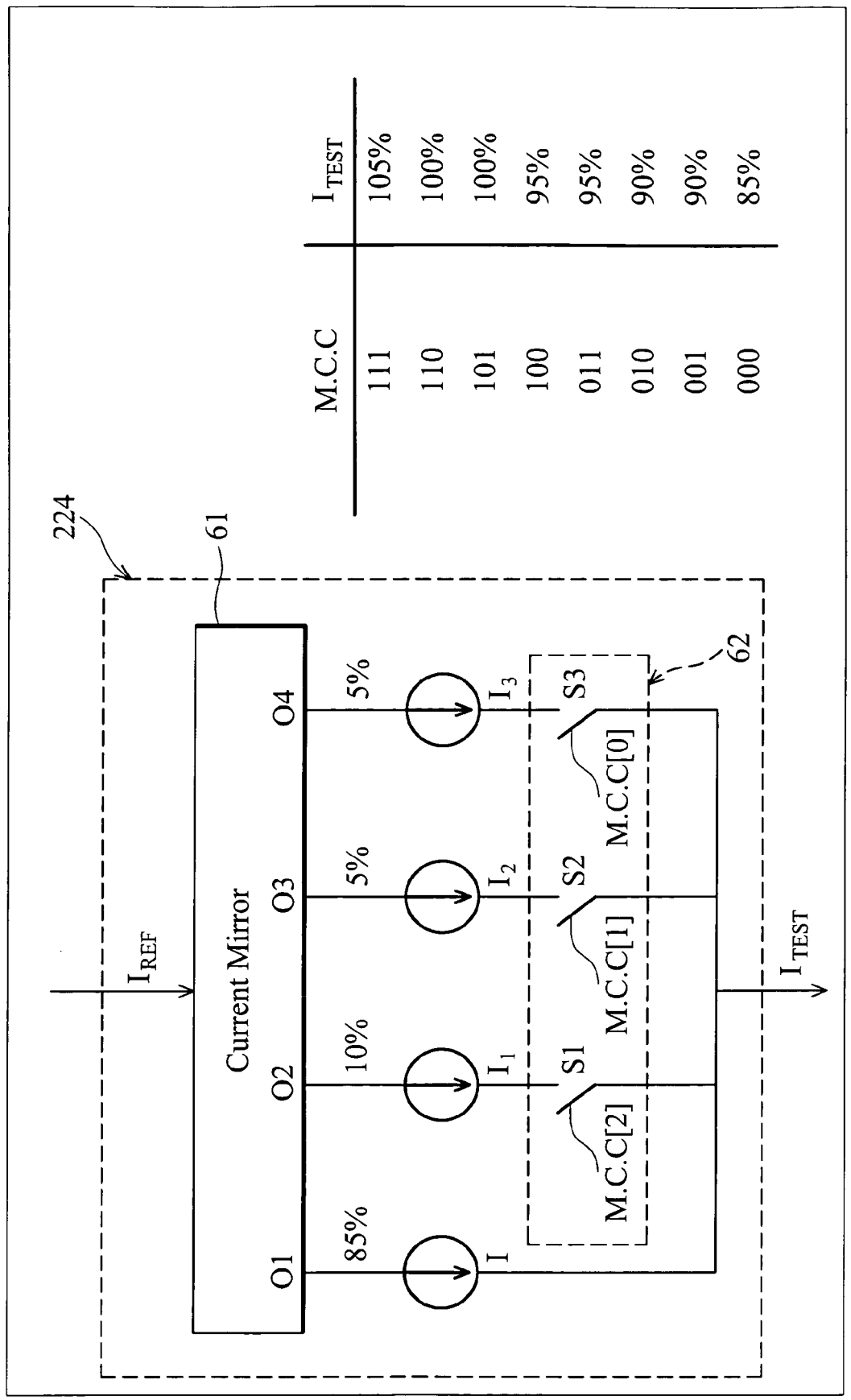
FIG. 6 is a schematic diagram of a dynamic current source 224 of FIG. 3 in accordance with an embodiment of the invention.

FIG. 6 is a schematic diagram of a dynamic current source 224 of FIG. 3 in accordance with an embodiment of the invention. It is noted that many other structures can be implemented to realize the dynamic current source 224 and here the schematic diagram is only used as an example. As shown in the figure, the dynamic current source 224 comprises a current mirror 61 connected externally to the reference current source 210 to receive the reference current $I_{REF}$ and four outputs O1 to O4 respectively outputting 85% of $I_{REF}$ (I), 10% $I_{REF}$ (I₁), 5% of $I_{REF}$ (I₂) and 5% of $I_{REF}$ (I₃). The dynamic current source 224 further comprises a switch array 62 consisting of switches S1 to S3 respectively connected between the outputs O2-O4 and the memory 202 (not shown). The switches S1-S3 are respectively controlled by M.C.C [2] to M.C.C [0] from the MCC decoder 222. Due to the fixed base current (I) and different combination of the on and off switches S1-S3 controlled by MCC, the dynamic current source 224 is capable of producing different current. For example, when MCC is 100, switch S1 is on while switches S2 and S3 are off. The dynamic current source 224 thus provides test current $I_{TEST}$ 95% times the reference current $I_{REF}$; when MCC is 110, switches S1 and S2 are on while switch S3 is off. The dynamic current source 224 thus provides test current $I_{TEST}$ 100% times the reference current $I_{REF}$; and so forth. If more different currents are required, number of outputs and switches is increased, and the current through each output is adjusted.

Figure 7:
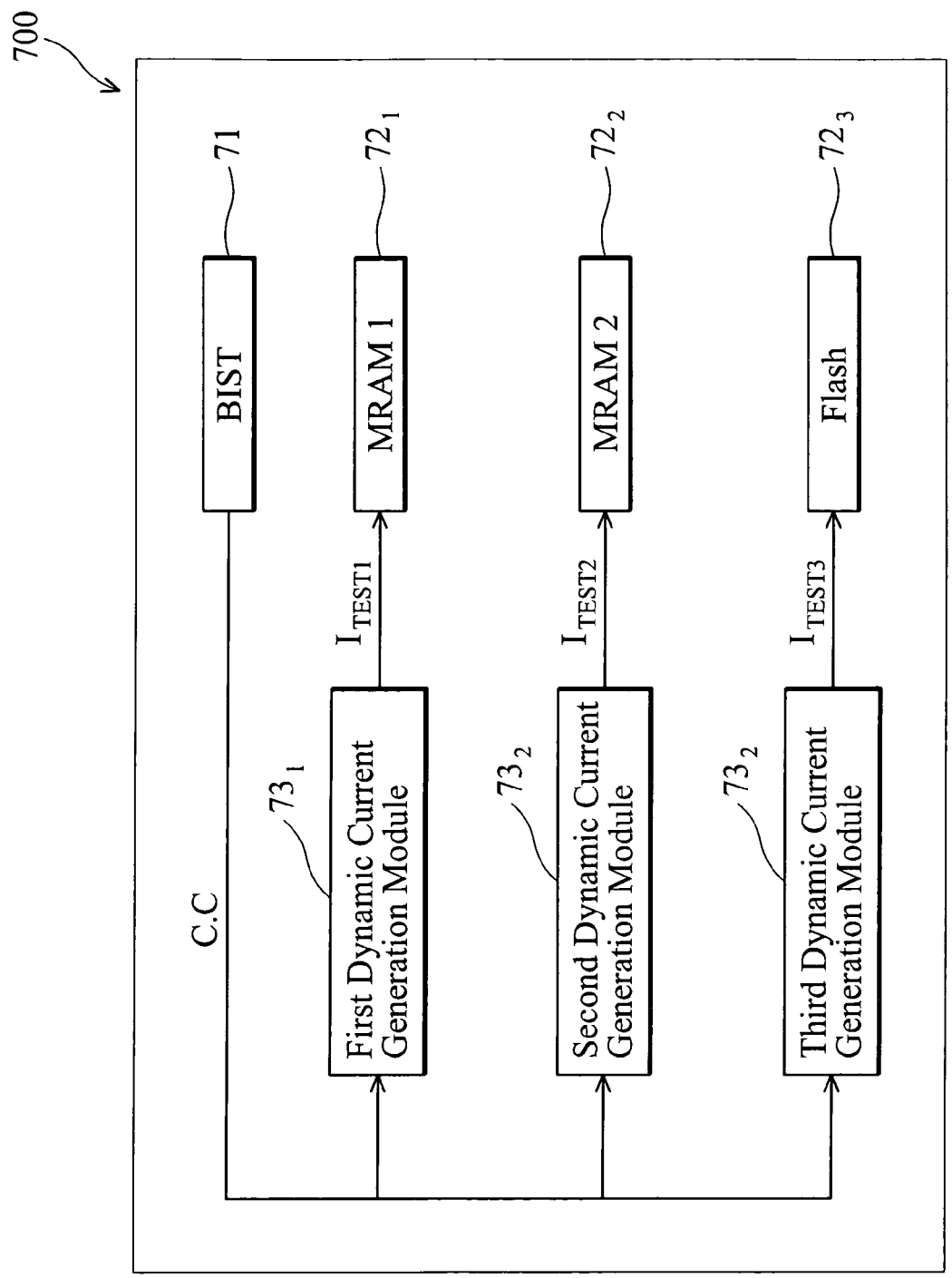
FIG. 7 is a block diagram of a memory test circuit testing a plurality of memories of a system on a chip in accordance with another embodiment of the invention.

FIG. 7 is a block diagram of a memory test circuit to test a plurality of memories of a system on a chip (SOC) in accordance with another embodiment of the invention. As shown, a SOC chip 700 comprises a BIST 71, a first and second MRAM $72_1$ and $72_2$, a flash $72_3$, a first dynamic current generation module $73_1$, connected between the first MARM $72_1$ and the BIST 71, a second dynamic current generation module $73_2$ connected between the second MARM $72_2$ and the BIST 71, and a third dynamic current generation module $73_3$ connected between the flash $72_3$ and the BIST 71. Embodiments of the block diagrams for BIST 71 and the first to third current generation modules $73_1$-$73_3$ can be referred to FIGS. 3 and 6 and descriptions thereof. Since different memories require different test currents, the first to third dynamic current generation modules $73_1$-$73_3$ are required to meet different test current requirements of the memories. For example, either of the first to third dynamic current generation modules $73_1$-$73_3$ can comprise a MCC decoder 222 and a dynamic current source 224 as in FIG. 3, and the structure of the dynamic current source 224 can be referred to FIG. 6 wherein the current from the internal outputs O2 to O4 can be designed as required by memories $72_1$-$72_3$. As such, the first MARM $72_1$, the second MARM $72_2$ and the flash $72_3$ can be tested in parallel simultaneously. Resultingly, the total test time equals the test time for a single memory. Compared to the total test time $$\sum_{2}^{3} T_{ATE}(n) + \sum_{1}^{3} T_M(n)$$

(referring to the test algorithm (3) in conventional technology), the total test time of the invention is decreased greatly. It is noted that when the MCC decoder 222 and the dynamic current source 224 shown in FIG. 3 are taken to realize the first to third dynamic current generation modules $73_1$-$73_3$, the first to third dynamic current generation modules $73_1$-733 can share the same MCC decoder 222 rather than having respective MCC decoders 222. Further, the first and second MRAM $72_1$, and $72_2$ and the flash $72_3$ can be controlled by respective BISTs rather than controlled by a single BIST. It is also noted that when the structure of FIG. 3 is implemented as the BISTs connected respectively to the first and second MRAM 72₁ and 72₂, and flash 72₃, the BISTs can share the same memory command generator 216 rather than having respective memory command generators 216.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A built-in memory current test circuit to perform a test on a memory on a chip, comprising:
    a built-in self-test circuit disposed on the chip, receiving a test signal corresponding to a test algorithm, producing a control signal to control operations of the memory and a current control code,
        wherein the test algorithm is a sequence consisting of at least one test element each representing at least one successive memory operation; and
    a dynamic current generation module disposed on the chip, receiving the current control code and generating a test current to the memory according to the current control code.

2. The built-in memory current test circuit of claim 1, wherein the at least one memory writing operation represented by the test element corresponding to a respective test current.

3. The built-in memory current test circuit of claim 2, wherein the sequence comprises at least two successive memory operations comprising at least two writing operations performed with two different test current.

4. The built-in memory current test circuit of claim 3, wherein both of the two writing operations performed with two different test currents.

5. The built-in memory current test circuit of claim 4, wherein the test algorithm is $\{ǂ(w_10);⇑(r0, w_11);⇑(r1, w_11);⇓(r0, w_2 1,r1);⇓(r1,w_2 0, r0);ǂ(r0)\}$.

6. The built-in memory current test circuit of the claim 2, wherein the test algorithm comprises a test element representing memory operations comprising at least two writing operations corresponding to different test currents.

7. The built-in memory current test circuit of claim 1, wherein the built-in self-test circuit comprises:
    a controller receiving the test signal, generating an element code and a background signal, wherein the element code corresponds to successive reading operations, writing operations and the test current with which a writing operation is performed, and the background signal controls writing or reading directions or bit to be written or read represented by each of the test elements of the test algorithm; and
    a memory command generator receiving the element code, decoding the element code into a high level operation code and a current control code, wherein the high level code controls the reading or writing operations of the memory and the current control code is provided to the dynamic current generation module to control the test current.

8. The built-in memory current test circuit of the claim 7, further comprising a pattern generator receiving and converting the background signal to a writing data signal and an address signal required by the memory and transferring the writing data signal and the address signal to the memory.

9. The built-in memory current test circuit of the claim 7, further comprising a command converter receiving and converting the high level code to a read/write enable signal and a chip signal required by the memory and then providing the read/write enable signal and the chip enable signal to the memory.

10. The built-in memory current test circuit of the claim 7, wherein the dynamic current generation module comprises:
    a dynamic current source; and
    a memory current control decoder converting the current control code to a memory current control signal required by the dynamic current source and providing the memory current control signal to the dynamic current source to control the dynamic current source to generate the test current.

11. The built-in memory current test circuit of the claim 10, wherein the dynamic current source comprises:
    a current mirror comprising a plurality of outputs to output a plurality of current; and
    a plurality of switches each connected between one of the outputs and the memory and turned on or off according to the memory current control signal.

12. A built-in memory current test circuit to perform a test on a plurality of memories on a chip, comprising:
    a built-in self-test circuit disposed on the chip, receiving a test signal corresponding to a test algorithm, producing a control signal to control the operations of the memories and a current control code,
        wherein the test algorithm is a sequence consisting of at least one test element each representing at least one successive memory operation; and
    a plurality of dynamic current generation modules disposed on the chip, each receiving the current control code and generating a test current to the memory connected thereto according to the current control code.

13. The built-in memory current test circuit of the claim 12, further comprising a memory control current decoder connected between the built-in self-test circuit and each of the dynamic current sources, receiving and converting the current control code into a memory current control signal required by the dynamic current sources, and transmitting the memory current control signal to each of the dynamic current sources to control the dynamic current sources to generate the test currents respectively.

14. The built-in memory current test circuit of the claim 12, further comprising a plurality of memory control current decoders each connected between the built-in self-test circuit and each of the dynamic current sources, receiving and converting the current control code into a memory current control signal required by the dynamic current source connected thereto, and transmitting the memory current control signal to each of the dynamic current sources to control the dynamic current sources connected thereto to generate the test current.

15. A built-in memory current test circuit to perform a test on a plurality of memories on a chip, comprising:
    a plurality of built-in self-test circuits disposed on the chip, each connected to one of the memories and receiving a test signal corresponding to a test algorithm, producing a control signal to control the operations of the memories and a current control code, wherein the test algorithm is a sequence consisting of at least one test element, wherein each of the test elements represents at least one successive memory operation; and a plurality of dynamic current generation modules disposed on the chip, each coupled to the current control code generated by one of the built-in self-test circuits and generating a test current to the memory connected thereto according to the current control code.

16. A built-in memory current test circuit to perform a test on a plurality of memories on a chip, comprising:

a plurality of built-in self-test circuits disposed on the chip, each connected to one of the memories and receiving a test signal corresponding to a test algorithm, producing a control signal to control the operations of the memories and an element code corresponding to successive reading operations, writing operations and a test current with which a writing operation is performed wherein the test algorithm is a sequence consisting of at least one test element each representing at least one successive memory operation;

a memory command generator receiving the element code, decoding the element code into a high level code and a current control code, wherein the high level code controls reading or writing operations of the memories and is provided to the memories, and the current control code controls the test current; and a plurality of dynamic current generation modules disposed on the chip, each coupled to the current control code and generating a test current to the memory connected thereto according to the current control code.

17. The built-in memory current test circuit of the claim 16, further comprises a memory control current decoder connected between the built-in self-test circuit and each of the dynamic current sources, receiving and converting the current control code into a memory current control signal required by the dynamic current sources, and transmitting the memory current control signal to each of the dynamic current sources to control the dynamic current sources to generate the test currents respectively.

18. The built-in memory current test circuit of the claim 16, further comprising a plurality of memory control current decoders each connected between the built-in self-test circuit and each of the dynamic current sources, receiving and converting the current control code into a memory current control signal required by the dynamic current source connected thereto, and transmitting the memory current control signal to each of the dynamic current sources to control the dynamic current sources connected thereto to generate the test current.

* * * * *